(12) United States Patent
Park

(10) Patent No.: US 8,014,201 B2
(45) Date of Patent: Sep. 6, 2011

(54) NONVOLATILE MEMORY DEVICE EXTRACTING PARAMETERS AND NONVOLATILE MEMORY SYSTEM INCLUDING THE SAME

(75) Inventor: Ki-Tae Park, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 103 days.

(21) Appl. No.: 12/458,398

(22) Filed: Jul. 10, 2009

(65) Prior Publication Data

US 2010/0027337 A1   Feb. 4, 2010

(30) Foreign Application Priority Data

Jul. 30, 2008   (KR) .................... 10-2008-0074746

(51) Int. Cl.
*G11C 11/34* (2006.01)
(52) U.S. Cl. .................... 365/185.11; 365/185.24
(58) Field of Classification Search .............. 365/185.11, 365/185.24
See application file for complete search history.

(56) References Cited

U.S. PATENT DOCUMENTS

| 7,463,520 B2 * | 12/2008 | Aritome | 365/185.12 |
| 2009/0032794 A1 * | 2/2009 | Hsiao | 257/4 |

FOREIGN PATENT DOCUMENTS

| JP | 2000-182292 | 6/2000 |
| JP | 2004-030311 | 1/2004 |
| JP | 2005-190622 | 7/2005 |
| KR | 10-2008-0000953 | 1/2008 |

* cited by examiner

*Primary Examiner* — Michael T Tran
(74) *Attorney, Agent, or Firm* — Harness, Dickey & Pierce, P.L.C.

(57) ABSTRACT

The nonvolatile memory device includes a memory cell array having a plurality of memory blocks and a control logic circuit configured to store a parameter to access at least one of the plurality of memory blocks, configured to detect a variation of the parameter while accessing the at least one the memory block, and configured to store the varied parameter into the memory cell array in accordance with a result of the detection, wherein the control logic circuit is configured to utilize the varied parameter, which is stored in the memory cell array, while accessing the at least one memory block.

15 Claims, 20 Drawing Sheets

NONVOLATILE MEMORY DEVICE EXTRACTING PARAMETERS AND NONVOLATILE MEMORY SYSTEM INCLUDING THE SAME

PRIORITY STATEMENT

This U.S. non-provisional patent application claims priority under 35 U.S.C. §119 of Korean Patent Application No. 10-2008-74746 filed on Jul. 30, 2008, the entire contents of which are incorporated herein by reference.

BACKGROUND

Example embodiments disclosed herein are related to nonvolatile memory devices, for example, to a flash memory device extracting parameters therefrom.

Nonvolatile memory devices, such as flash memory devices, are electrically erasable and programmable read-only memories (EEPROMs) in which a plurality of memory regions are erased or written with data by one-time operation of programming. A traditional EEPROM is operable such that a single memory region is erasable or programmable at a time. Thus, the flash memory device operates more rapidly and effectively in reading and writing data when systems employing the flash memory device read/write data from/into different memory regions at the same time. Many types of flash memory devices or EEPROMs are usually configured in structure such that insulation films enclosing charge storage elements used for storing data are inevitably worn out after a specific number of operations.

Flash memory devices reserve information on their silicon chips even without a power supply. For example, flash memory devices are able to retain their information without power consumption even in a condition of power interruption to the chips thereof. Additionally, flash memory devices are generally more resistive to physical impacts, thus offering faster accessibility for reading. As a result, the flash memory devices are generally used as storage units in electronic apparatuses powered up by batteries. Flash memory devices may be classified into two types, e.g., NOR and NAND types, in accordance with a logical array pattern of gates used each for storage elements.

A flash memory device is configured to store information in an array of transistors called cells, each of the cells containing at least 1-bit data. A multi-level cell (MLC) flash memory device is able to store more than 1 bit by varying an amount of charge accumulated in a floating gate of the transistors.

SUMMARY

According to example embodiments, a nonvolatile memory device includes a memory cell array having a plurality of memory blocks and a control logic circuit configured to store a parameter to access at least one of the plurality of memory blocks, configured to detect a variation of the parameter while accessing the at least one the memory block, and configured to store the varied parameter into the memory cell array in accordance with a result of the detection, wherein the control logic circuit is configured to utilize the varied parameter, which is stored in the memory cell array, while accessing the at least one memory block.

In example embodiments, the parameter includes at least one of program-start voltage, erase-start voltage, duration of pulse applied during program and erasing operations, ISPP step level, the maximum number of pulse loops, pass voltage applied to unselected cells, read voltage level, precharging and developing voltages by time, and read voltage level applied to unselected regions.

In example embodiments, the control logic circuit is configured to program the memory cell array to a target voltage level according to a program voltage and configured to set the program voltage as the program-start voltage if at least one memory cell of the memory cell array corresponding to at least one bit is programmed.

In example embodiments, the control logic circuit is configured to erase the memory cell array to a target voltage level according to an erase voltage and configured to set the erase voltage as the erase-start voltage if at least one memory cell of the memory cell array corresponding to at least one bit is erased.

In example embodiments, the parameter is stored in at least one of the plurality of memory blocks.

In example embodiments, the memory block includes data and spare fields, where the spare field stores the parameter.

In example embodiments, the control logic circuit is configured to detect a maximum value of a threshold voltage distribution of memory cells of the memory cell array, and configured to set a read voltage with reference to a result of the maximum value detected.

In example embodiments, the maximum value of the threshold voltage distribution corresponds to a same number of passed and failed memory cells of the memory cell array.

In example embodiments, the memory cell array includes at least one of a phase-change random access memory, magneto-resistance random access memory, and resistive random access memory.

According to example embodiments, a nonvolatile memory device having a plurality of memory blocks and a controller configured to store a parameter to access at least one of the memory blocks, configured to detect variation of the parameter while accessing the at least one memory block, and configured to store the varied parameter into the nonvolatile memory device in accordance with a result of the detection, wherein the controller is configured to utilize the varied parameter, which is stored in the nonvolatile memory device, while accessing the at least one memory block.

In example embodiments, the nonvolatile memory device includes a memory cell array having the plurality of memory blocks and a control logic circuit configured to control programming, erasing, and reading operations of the memory cell array.

In example embodiments, the controller is configured to program the memory cell array to a target voltage level according to a program voltage and configured to set the program voltage as the program-start voltage if at least one memory cell of the memory cell array corresponding to at least bit is programmed.

In example embodiments, the controller is configured to erase the memory cell array to a target voltage level according to an erase voltage and configured to set the erase voltage as the erase-start voltage if at least one memory cell of the memory cell array corresponding to at least one bit is erased.

In example embodiments, the controller is configured to detect a maximum value of a threshold voltage distribution of memory cells of the memory cell array, and configured to set a read voltage with reference to a result of the maximum value detected.

In example embodiments, the nonvolatile memory device includes at least one of a phase-change random access memory, magneto-resistance random access memory, and resistive random access memory.

Example embodiments may be able to optimize or determine proper parameters by evaluating reference parameters to planes, blocks, and pages in the flash memory device.

A further understanding of the nature and advantages of example embodiments may be realized by reference-to the remaining portions of the specification and the attached drawings.

BRIEF DESCRIPTION

Non-limiting and non-exhaustive example embodiments will be described with reference to the following figures, wherein like reference numerals refer to like parts throughout the various figures unless otherwise specified. In the figures.

DETAILED DESCRIPTION

Figure 1:
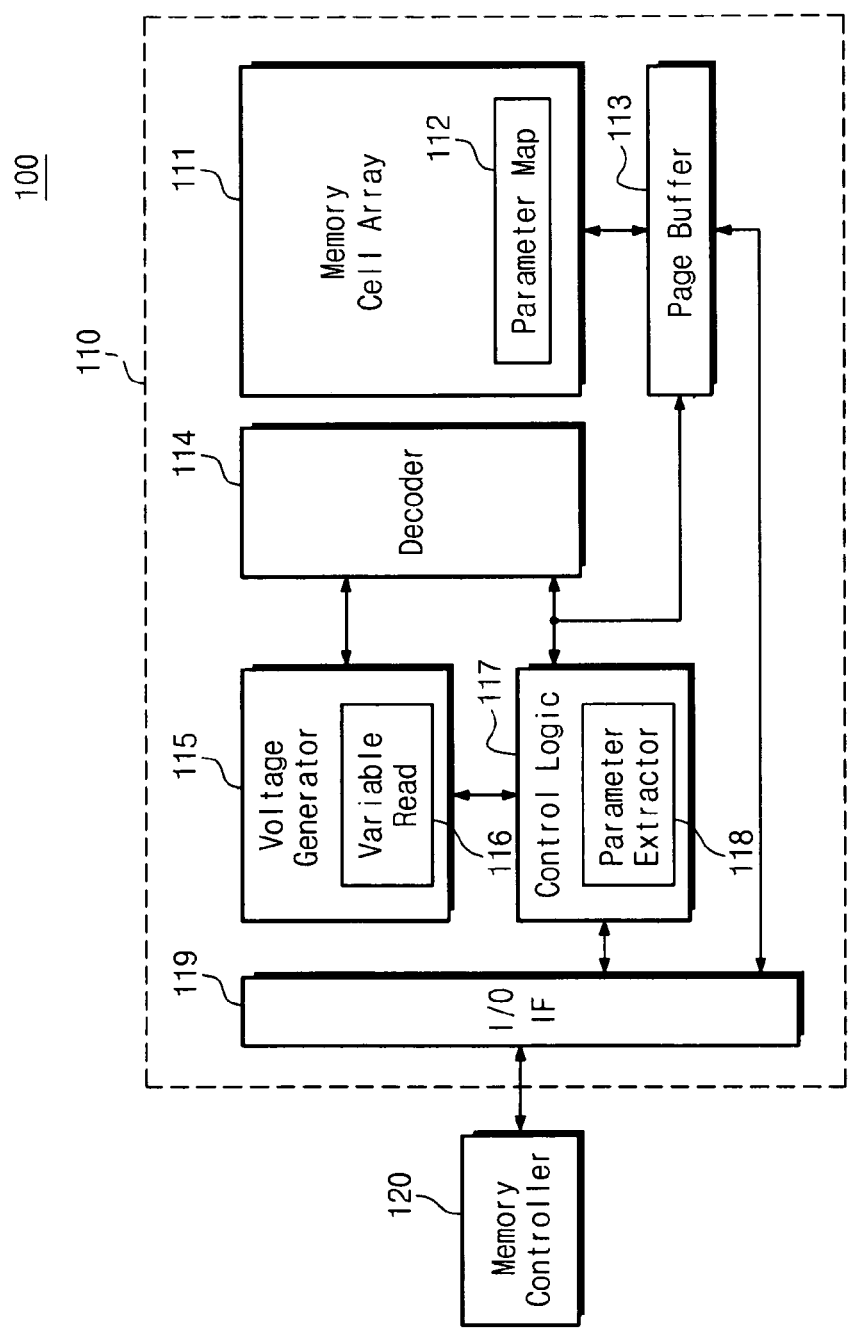
FIG. 1 is a block diagram of a memory system according to example embodiments.

Example embodiments will now be described more fully with reference to the accompanying drawings. In the drawings, the thicknesses of layers and regions may be exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof. In this specification, the term "and/or" picks out each individual item as well as all combinations of them.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

When it is determined that a detailed description related to a related known function or configuration may make the purpose of example embodiments unnecessarily ambiguous, the detailed description thereof will be omitted. Also, terms used herein are defined to appropriately describe example embodiments and thus may be changed depending on a user, the intent of an operator, or a custom. Accordingly, the terms must be defined based on the following overall description within this specification.

Example embodiments will be described below in more detail with reference to the accompanying drawings. Example embodiments may, however, be embodied in different forms and should not be constructed as limited to the embodiments set forth herein. Rather, these embodiments are provided so that this disclosure will be thorough and complete, and will fully convey the scope Example embodiments to those skilled in the art. Like reference numerals refer to like elements throughout the accompanying figures.

Figure 2:
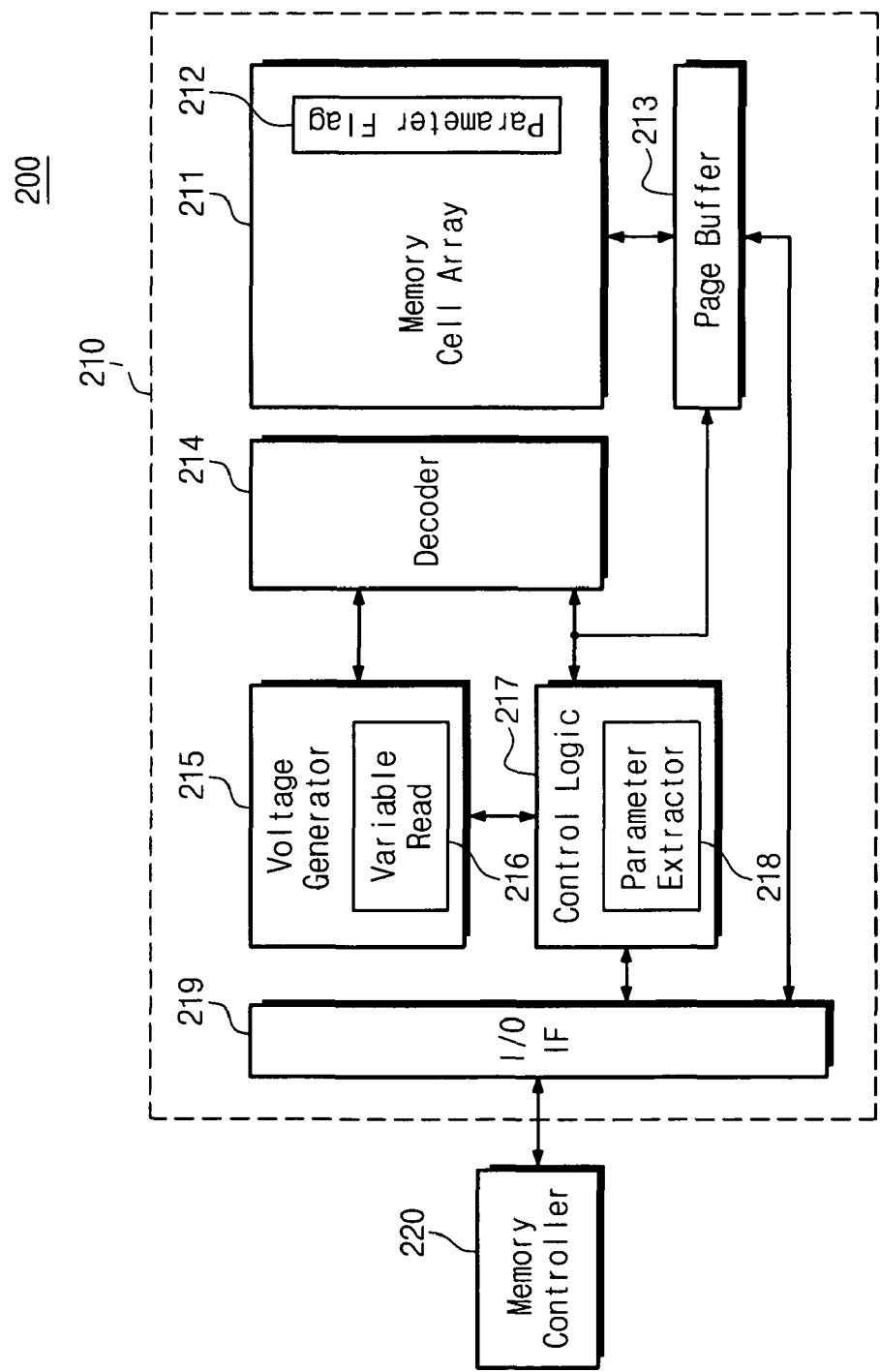
FIG. 2 is another block diagram of a memory system according to example embodiments.
Figure 3:
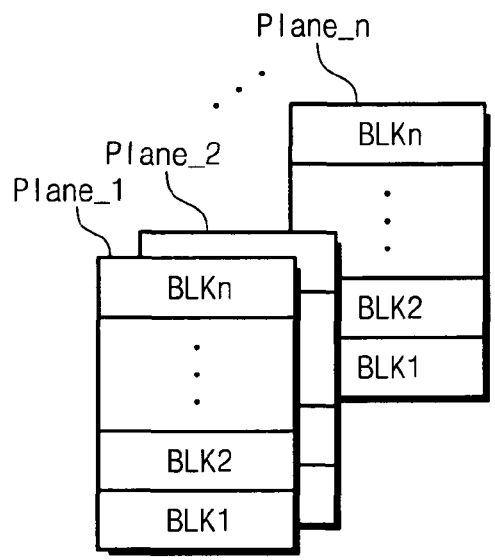
FIG. 3 is a block diagram of the memory array shown in FIGS. 1 and 2.

FIG. 1 is a block diagram of a memory system 100 according to example embodiments. FIG. 2 is another block diagram of a memory system 200 according to example embodiments. FIG. 3 is a block diagram of the memory array shown in FIGS. 1 and 2.

Referring to FIGS. 1 and 2, the memory system 100, 200 includes a flash memory device 110, 210 and a memory controller (or flash controller) 120, 220.

A control logic circuit 117 shown in FIG. 1 includes a parameter extractor 118. Thereby, the memory system 100 according to example embodiments obtains parameters using the parameter extractor 118 of the control logic circuit 117. Extracted parameters are stored in a parameter map 112 shown in FIG. 1 or in a parameter flag 212 shown in FIG. 2. A memory array 111 of FIG. 1 includes the parameter map 112 while a memory array 211 of FIG. 2 includes the parameter flag 212. The parameter map 112 may be implemented by an arbitrary block in the memory array 111. The parameter flag 212 may be implemented with a spare block in the memory array 211.

In example embodiments, the flash memory device 110 may be a NAND-type flash memory device, but it is not restrictive hereto. While example embodiments are illustrated in reference to a flash memory devices, example embodiments may also include other types of nonvolatile memory, e.g., phase-change random access memory (PRAM), magnetic or magneto-resistance RAM (MRAM), or resistive RAM (RRAM).

As illustrated in FIG. 1, the flash memory device 110 includes the memory cell array 111 for storing M-bit data information (where M is 1 or a positive integer larger than 1). The memory cell array 111 may be sectored into a plurality of storage regions. These memory regions may include a plurality of data fields storing normal data and a spare field. Each storage region of the memory cell array 111 may be composed of a plurality of memory blocks. A structural configuration of the memory block is well known by those skilled in the art, and so will not be further described.

The flash memory device 110 according to example embodiments includes a page buffer 113, a decoder 114, a voltage generator 115, the control logic circuit 117, and an input/output interface circuit 119. The page buffer 113 is configured to read/program data from/into the memory cell array 111 under control of the control logic circuit 117. The decoder 114 operates under control of the control logic circuit 117, selecting a memory block of the memory cell array 111 and designating a word line of the selected memory block. A selected word line is driven according to a word line voltage supplied from the voltage generator 115. The voltage generator 115 operates under control of the control logic circuit 117, generating word line voltages (e.g., read voltage, program voltage, pass voltage, verification voltage, etc.) to be supplied into the memory cell array 111. The voltage generator 115 includes a read voltage generator 116 for generating the read voltage, which is used for discriminating between a variety of data states. The read voltage generator 116 operates to generate the read voltage to gradually increase/decrease by an increment/decrement in response to a control by the control logic circuit 117. The parameter extractor 118 controls the read voltage generator 116 to optimize a read voltage level to the memory array 111. The control logic circuit 117 is configured to control general operations of the flash memory device 110.

In FIG. 1, the memory controller 120 is configured to control the flash memory device 110 in response to a request by an external stimulus (e.g., host). Although not shown, the memory controller 120 may include a processing unit such as central processing unit (CPU) or microprocessor, an error check/correction (ECC) circuit, a buffer memory, and so on. The memory controller 120 communicates with the flash memory 110 via a input/output interface 119 of the flash memory 110. The input/output interface 119 also bi-directionally communicates with the page buffer 113 and the control logic 117.

In FIG. 2, the flash memory device 210 and a memory controller 220 of the memory system 200 may be at least somewhat similar to the flash memory 110 and memory controller 120 of the memory system 100 in FIG. 1. Therefore, those elements in FIG. 2 not described above may be similar to corresponding elements in FIG. 1. Thus, a description of those similar elements is omitted herein.

Referring to FIG. 3, the memory array 111 includes a plurality of planes Plane_1—Plane_n. Each plane includes pluralities of blocks BLK1-BLKn.

The characteristic of an arbitrary page represents a property of the block included in the respective page. This characteristic will be noticed by parameters. The parameters may include program/erase-start voltages, pulse time, the number of incremental step-pulse pumping (ISPP) steps, the maximum number of pulse loops, pass voltage (Vpass) applied to unselected cells, and so forth in programming/erasing operations. The parameters may also include read voltage levels, precharging/developing voltage time, read voltages (Vread) applied to unselected regions, and so on.

Referring to FIGS. 1 through 3, the parameter extractor 118 may extract the parameters from the memory cell array 111. A way of extracting the parameters will be described hereinafter with reference to the drawings.

Figure 4:
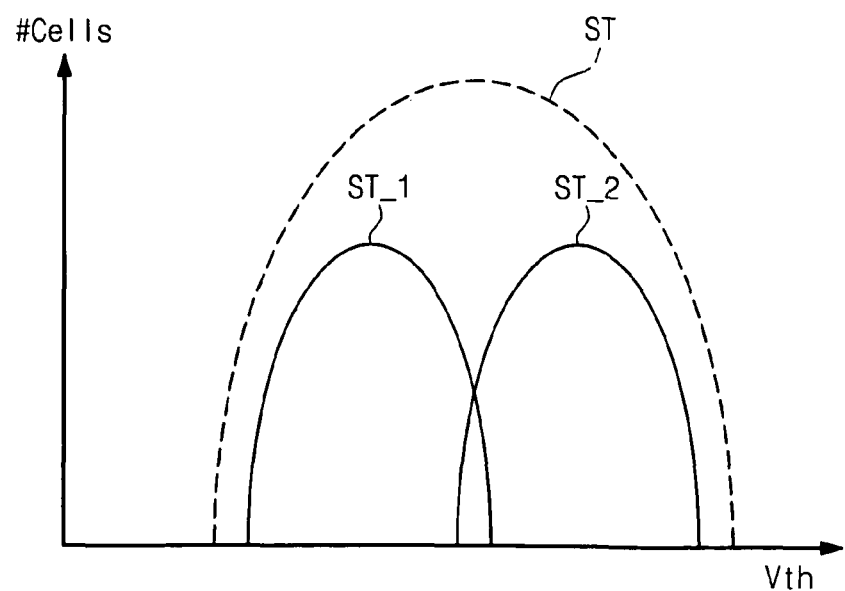
FIGS. 4 and 5 are graphic diagrams plotting threshold voltage distributions according to the first and second planes shown in FIG. 3.
Figure 5:
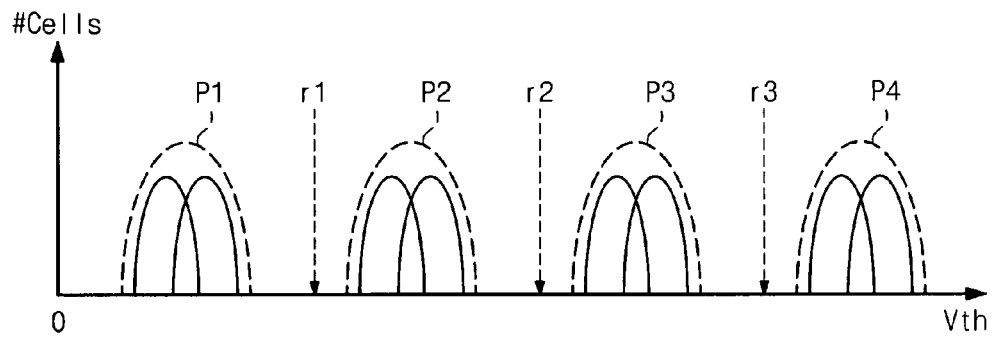

FIGS. 4 and 5 are graphic diagrams plotting threshold voltage distributions according to the first and second planes shown in FIG. 3.

Referring to FIG. 4, a first threshold-voltage distribution $ST_{13}1$ represent states of memory cells belonging to a first page of a first-block of a first plane. A second threshold-voltage distribution ST_2 represent states of memory cells belonging to a second page of a second block of a second plane. In this case, an actual threshold-voltage distribution ST is set to include the first and second threshold-voltage distributions ST_1 and ST_2.

The flash memory device 100 or 200 exemplified by FIGS. 1 or 2 includes the memory cell array 111 or 211 for storing information of M-bit data (M is 1 or a positive integer larger than 1). For instance, memory cells of the memory cell array 111 may be conditioned to have a plurality of threshold voltage distributions. e.g., first through fourth threshold-voltage distributions, as shown in FIG. 5. Further, the flash memory device 100 may be operable with first through third read voltages r1, r2 and r3, as shown in FIG. 5. The first through third read voltages r1~r3 are set to be proper to the threshold voltage distribution ST including the first and second threshold-voltage distributions ST_1 and ST_2 shown in FIG. 4.

In FIG. 4, as the threshold voltage distribution ST of the memory cell array 111 is set to include the first and second threshold-voltage distributions ST_1 and ST_2. Occasionally, program/erase-start voltages of blocks of the memory cell array 111 may be improper. Thus, a time for programming/erasing operations may be longer. Further, since a level of the read voltage may not be optimized, a time for reading/verifying operation may be longer.

Therefore, example embodiments offer a way for extracting parameters that are proper or optimized to each plane, block, and page. The parameters may include program/erase-start voltages, pulse time, the number of ISPP steps, the maximum number of pulse loops, read voltage levels, and precharging/developing voltage time.

Figure 6:
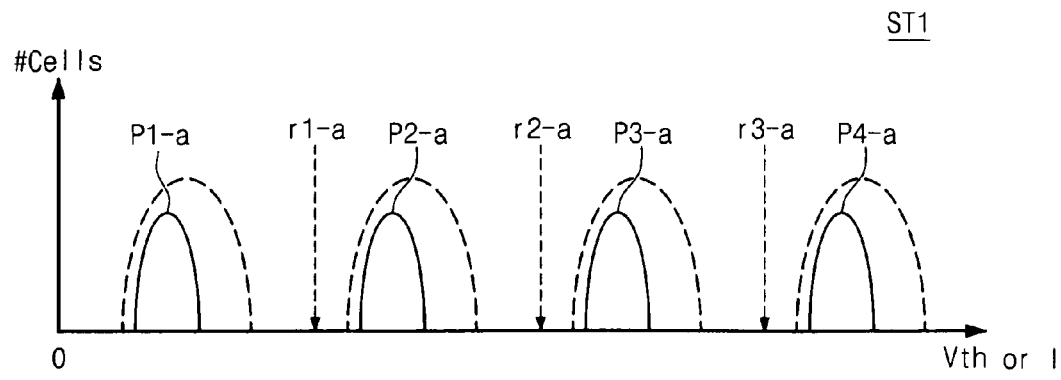
FIG. 6 is a graphic diagram plotting the first threshold-voltage distribution shown in FIG. 4.
Figure 7:
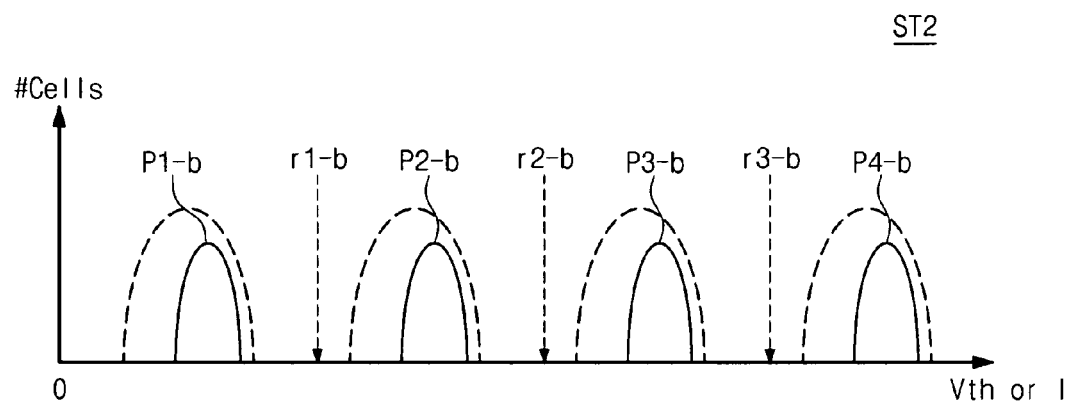
FIG. 7 is a graphic diagram plotting the second threshold-voltage distribution shown in FIG. 4.

FIG. 6 is a graphic diagram plotting the first threshold-voltage distribution ST_1 shown in FIG. 4, and FIG. 7 is a graphic diagram plotting the second threshold-voltage distribution ST_2 shown in FIG. 4.

The memory cells of the memory cell array 111 may be configured to have a plurality of threshold voltage distributions (e.g., the first through fourth threshold-voltage distributions as shown in FIGS. 5 and 6).

Referring to FIG. 6, the memory cells belonging to the first page of the first block of the first plane are configured to have the first through fourth threshold-voltage distributions P1_a~P4_a. Thus, the first through third read voltages r1_a~r3_a are set to be proper to the first through fourth threshold-voltage distributions P1_a~P4_a as shown in FIG. 6.

Referring to FIG. 7, the memory cells belonging to the second page of the second block of the second plane are configured to have the first through fourth threshold-voltage distributions P1_b~P4_b. Thus, the first through third read voltages r1_b~r3_b are set to be proper to the first through fourth threshold-voltage distributions P1_b~P4_b as shown in FIG. 7.

Figure 8:
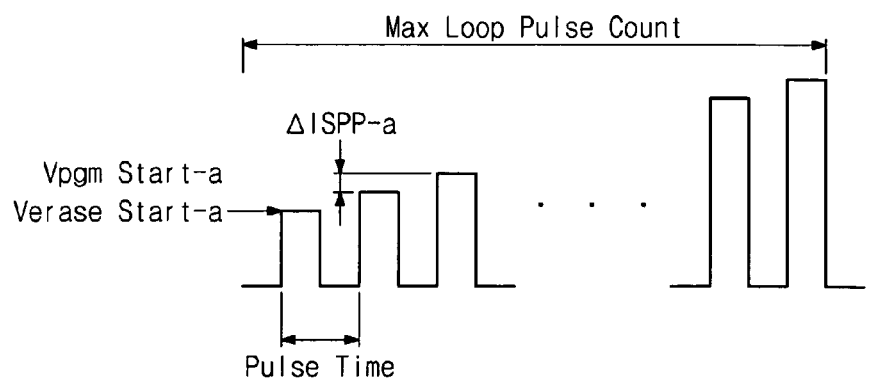
FIG. 8 is a timing diagram showing parameters of the first threshold-voltage distribution shown in FIG. 4.
Figure 9:
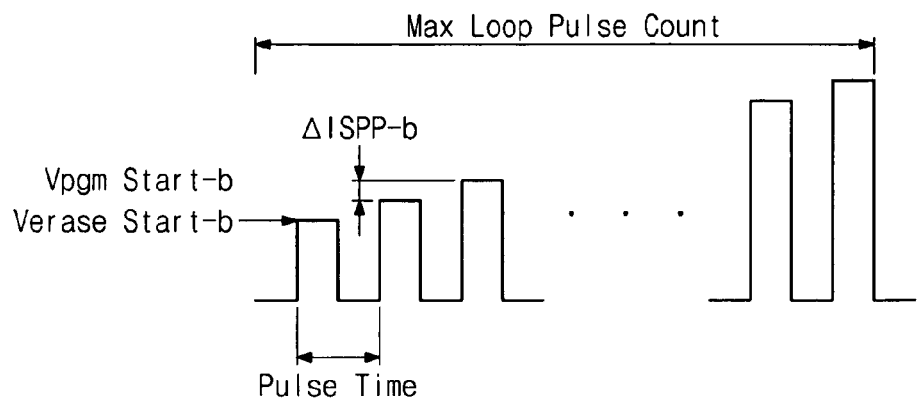
FIG. 9 is a timing diagram showing parameters of the second threshold-voltage distribution shown in FIG. 4.

FIG. 8 is a timing diagram showing parameters of the first threshold-voltage distribution shown in FIG. 4, and FIG. 9 is a timing diagram showing parameters of the second threshold-voltage distribution shown in FIG. 4.

The parameters may include a program-start voltage, an erase-start voltage, the number of ISPP steps, the maximum number of pulse loops, read voltage levels, and a precharging/developing voltage time. FIGS. 8 and 9 show a program-start voltage, an erase-start voltage, the number of ISPP steps, and the maximum number of pulse loops among the parameters.

Example embodiments allow for the extraction of the parameters proper or optimized to each plane, block, and page. Example embodiments also allow for setting the optimum or proper parameters corresponding to a selected plane, block, and page.

For example, referring to FIG. 8, the parameters for the a-th page belonging to the a-th block of the a-th plane may include the a-th program-start voltage Vpgm Start-a, the a-th erase-start voltage Verase Start-a, Δ ISPP-a, the a-th pulse time, and the maximum number of pulse loops. Referring to FIG. 9, the parameters for the b-th page belonging to the b-th block of the b-th plane may include the b-th program-start voltage Vpgm Start-b, the b-th erase-start voltage Verase Start-b, Δ ISPP-b, the b-th pulse time, and the maximum number of pulse loops.

The program-start voltage will be explained in more detail in conjunction with FIGS. 10 and 11. The erase-start voltage will be explained in more detail in conjunction with FIGS. 12 and 13. The precharging/developing voltage time will be explained in more detail in conjunction with FIGS. 14 through 16. The read voltage level and a way for setting a new read voltage level will be explained in more detail in conjunction with FIGS. 17 through 21.

Figure 10:
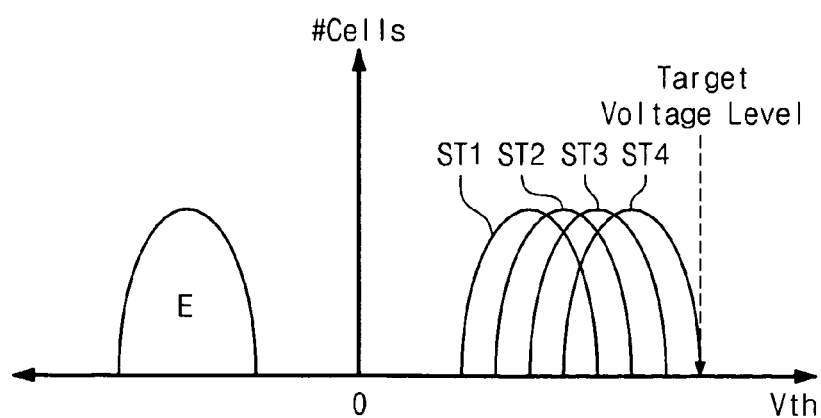
FIG. 10 is a graphic diagram showing a program-start voltage according to example embodiments.
Figure 11:
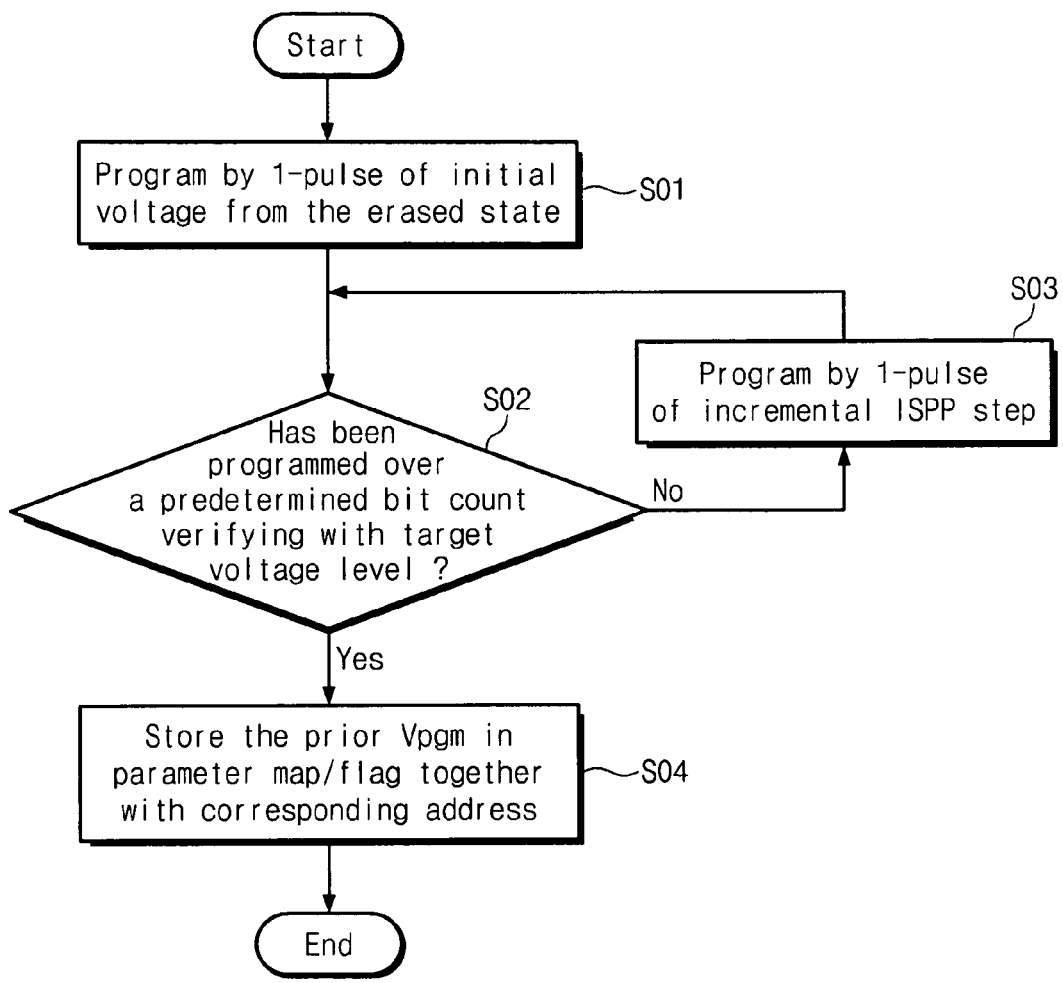
FIG. 11 is a flow chart showing a method for detecting the program-start voltage of FIG. 10.

FIG. 10 is a graphic diagram showing a program-start voltage according to example embodiments, and FIG. 11 is a flow chart showing a method for detecting the program-start voltage of FIG. 10.

According to example embodiments, a program-start voltage is determined by carrying out a programming operation until memory cells over a predetermined or otherwise determined number of bits are programmed to a target voltage level from an erased threshold-voltage distribution. The predetermined number of bits may be set to 1 or another arbitrarily value.

Referring to FIGS. 10 and 11, the procedure for finding a program-start voltage according to example embodiments includes the following steps: programming memory cells from the erased threshold-voltage distribution by applying a first pulse of an initial voltage (S01); verifying whether the memory cells have been programmed over the predetermined number of bits to the target voltage level (S02); reprogramming the memory cells by applying a pulse with increment of ISPP step unless they have been programmed over the predetermined number of bits and resuming the step S02 (S03); and storing the prior program voltage into the parameter map or flag of FIGS. 1 or 2 together with the corresponding address if the memory cells have been programmed over the predetermined number of bits and then terminating the procedure (S04).

In more detail, as shown in FIG. 10, the erased threshold-voltage distribution E goes to the first threshold-voltage distribution ST1 when a pulse of the initial voltage is applied to the memory cells by the step S01. In the step S02, it is determined whether the first threshold-voltage distribution ST1 includes memory cells, which reach the target voltage level, over the predetermined number of bits. Unless there are the memory cells over the predetermined number of bits at the target voltage level in the first threshold-voltage distribution, the programming operation is carried out by increasing the ISPP step with one pulse in the step S03 and the step S02 is resumed. Through the course of repeating the steps S02 and S03, the threshold voltage distribution transitions to ST4 from ST1. As the fourth threshold-voltage distribution ST4 includes memory cells, which reach the target voltage level, over the predetermined number of bits, the prior program voltage is stored in the parameter map or flag together with the corresponding address, in the step S04, and then the procedure is terminated.

Figure 12:
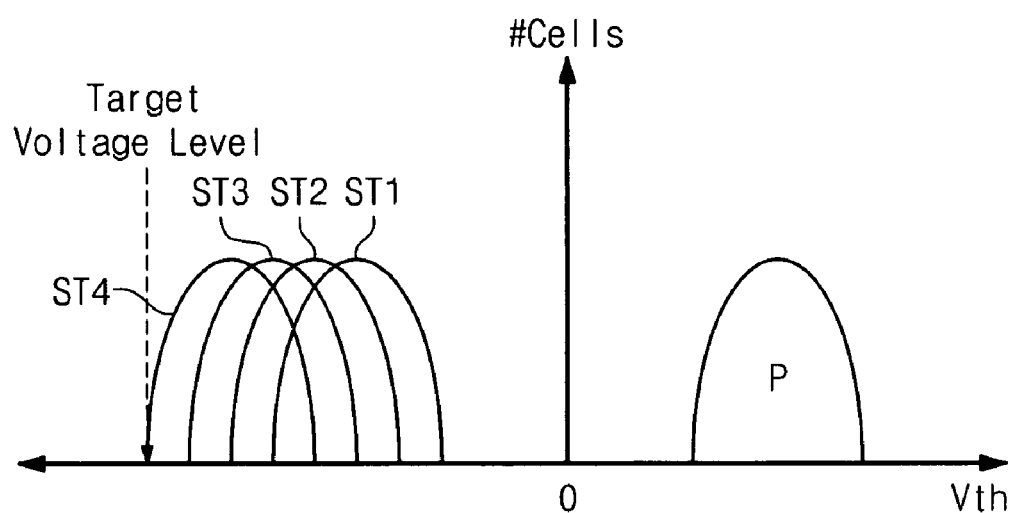
FIG. 12 is a graphic diagram showing an erase-start voltage according to example embodiments.
Figure 13:
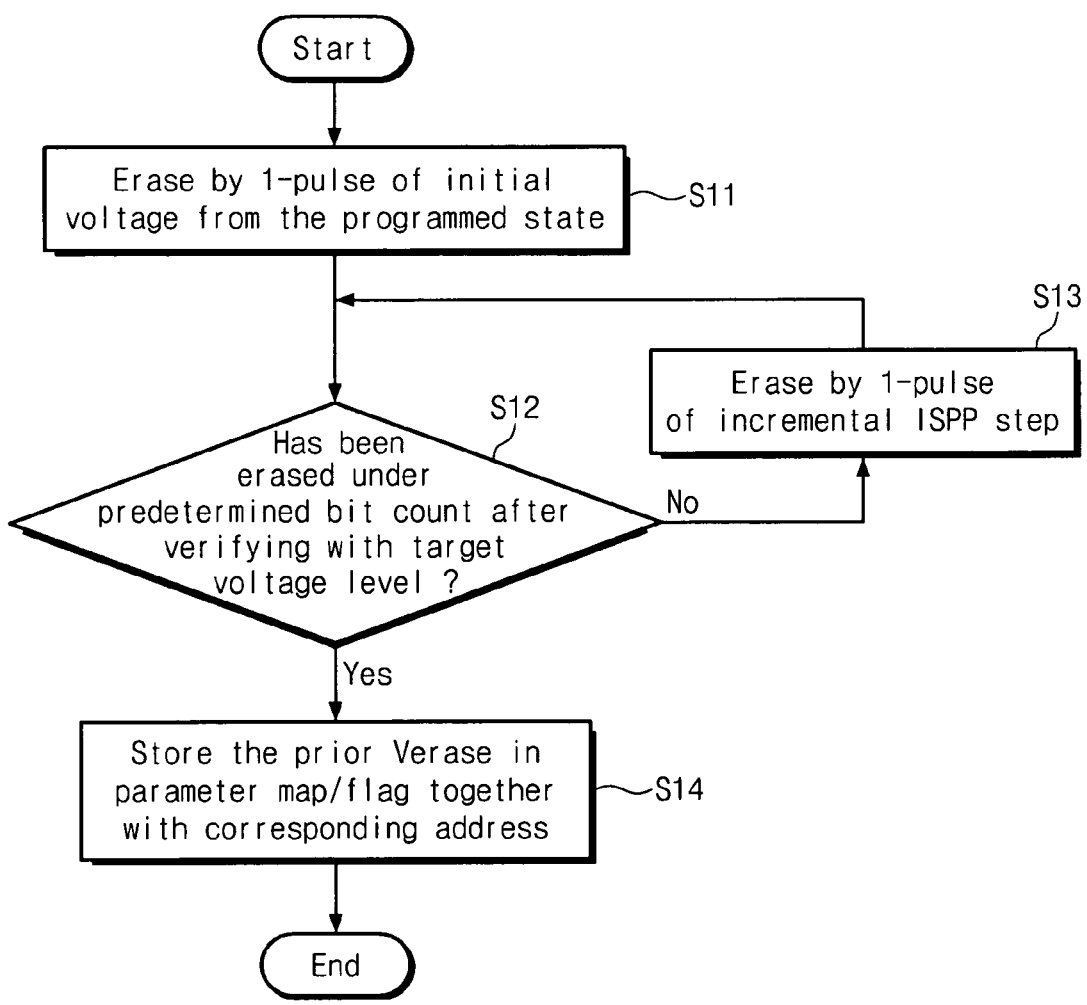
FIG. 13 is a flow chart showing a method for detecting the erase-start voltage of FIG. 12.

FIG. 12 is a graphic diagram showing an erase-start voltage according to example embodiments, and FIG. 13 is a flow chart showing a method for detecting the erase-start voltage of FIG. 12.

According to example embodiments, the erase-start voltage is determined by carrying out an erasing operation until memory cells under a predetermined number of bits are erased to a target voltage level from the programmed threshold-voltage distribution. The predetermined number of bits is set to be on 1 or another arbitrary value.

Referring to FIGS. 12 and 13, the procedure for finding an erase-start voltage according to example embodiments includes the following steps: erasing memory cells from the programmed threshold-voltage distribution by applying a first pulse of an initial voltage (S11); verifying whether the memory cells have been erased under the predetermined number of bits to the target voltage level (S12); re-erasing the memory cells by applying a pulse with increment of ISPP step unless they have been erased under the predetermined number of bits and resuming the step S12 (S13); and storing the prior erase voltage into the parameter map or flag of FIGS. 1 or 2 together with the corresponding address if the memory cells have been erased under the predetermined number of bits and then terminating the procedure (S14).

In more detail, as shown in FIG. 12, the programmed threshold-voltage distribution P goes to the first threshold-voltage distribution ST1 when a pulse of the initial voltage is applied to the memory cells by the step S11. In the step S12, it is determined whether the first threshold-voltage distribution ST1 includes memory cells, which reach the target voltage level, under the predetermined number of bits. Unless there are the memory cells over the predetermined number of bits at the target voltage level in the first threshold-voltage distribution, the erasing operation is carried out by increasing the ISPP step with one pulse in the step S13 and the step S12 is resumed. Through the course of repeating the steps S12 and S13, the threshold voltage distribution transitions to ST1 from ST4. As the fourth threshold-voltage distribution ST4 includes memory cells, which reach the target voltage level, under the predetermined number of bits, the prior erase voltage is stored in the parameter map or flag together with the corresponding address, in the step S14, and then the procedure is terminated.

Figure 14:
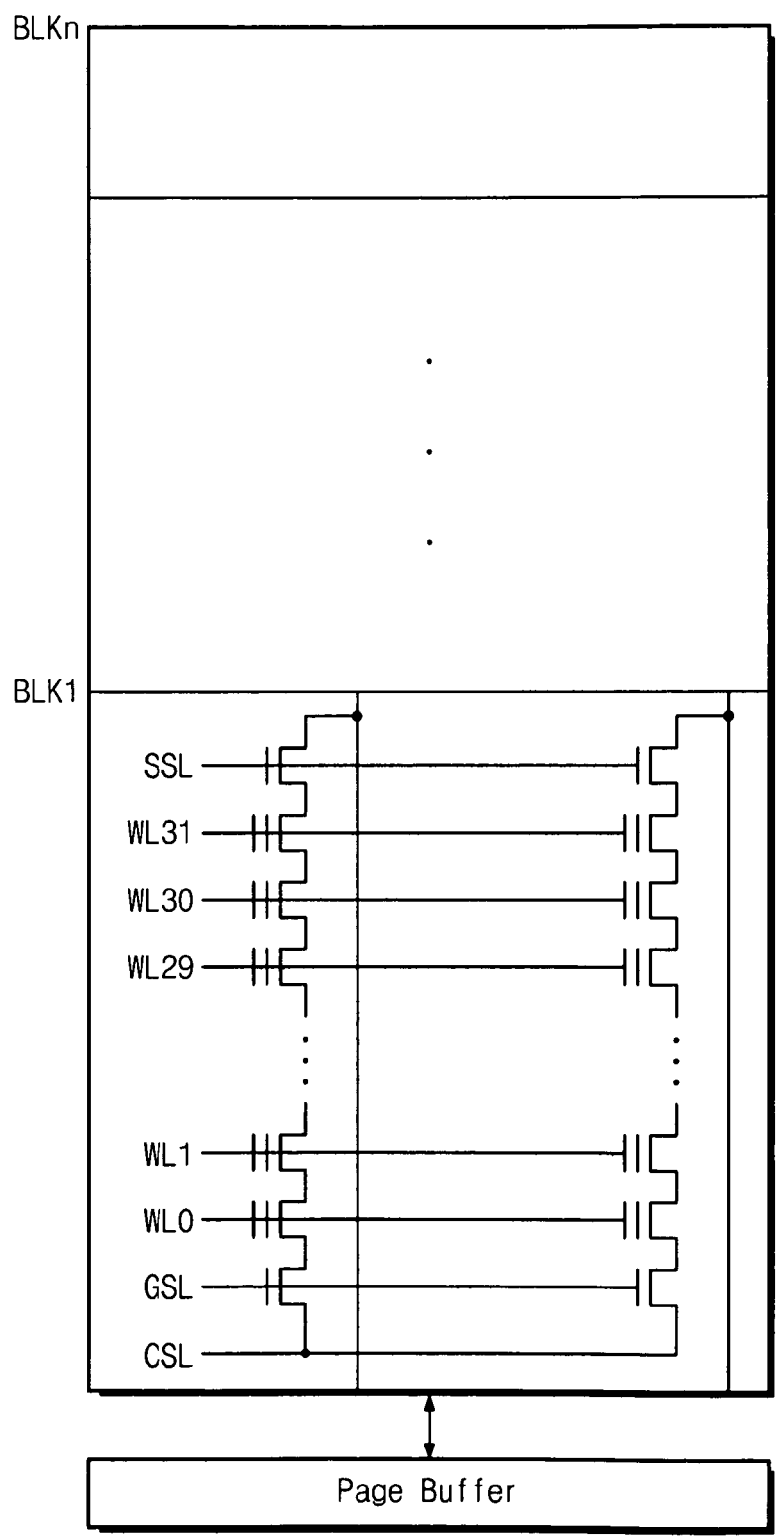
FIG. 14 is a circuit diagram illustrating cell strings of the memory array shown in FIG. 1.
Figure 15:
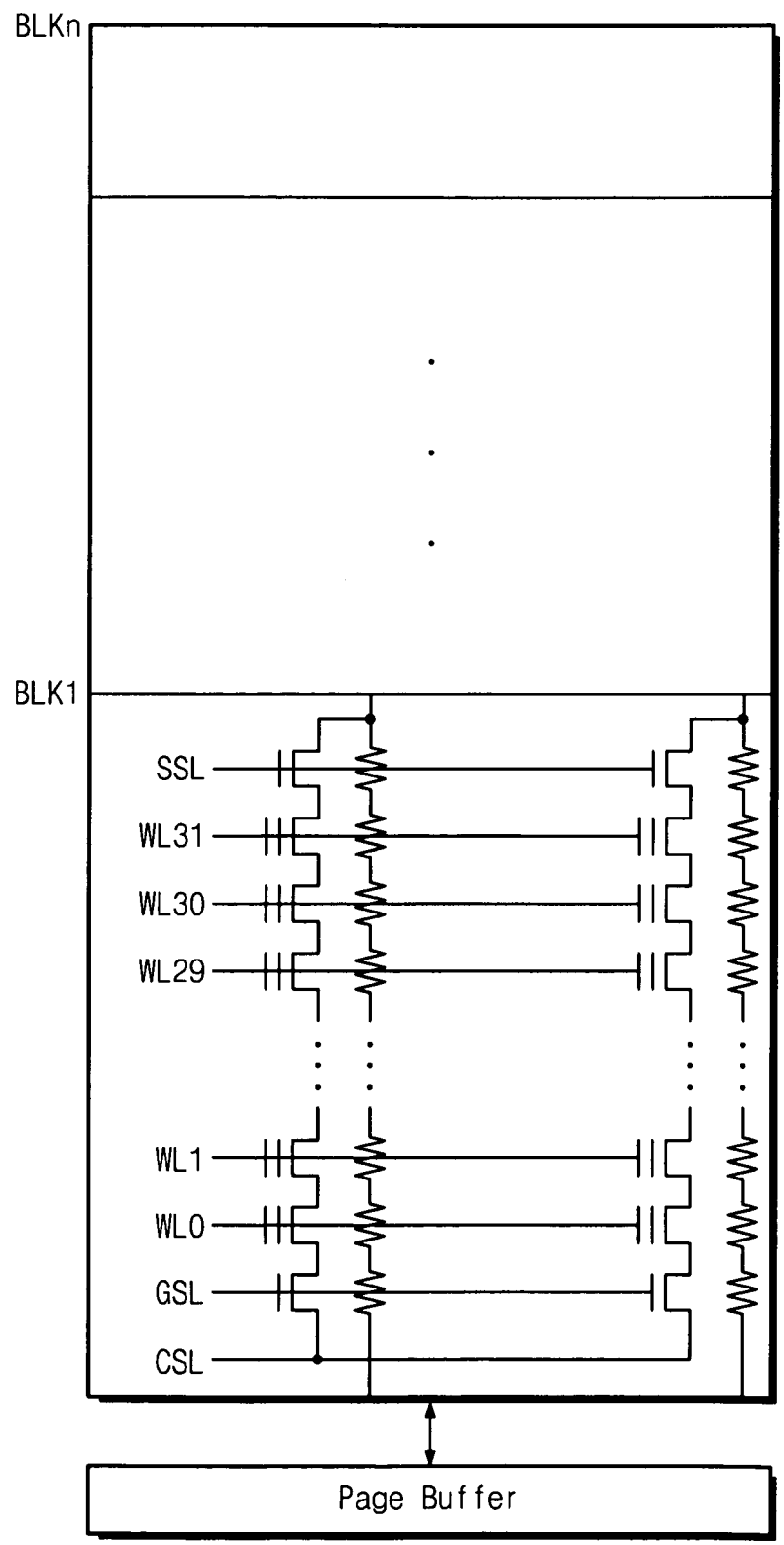
FIG. 15 is a circuit diagram illustrating replacing the bit lines of FIG. 14 with resistor columns.

FIG. 14 is a circuit diagram illustrating cell strings of the memory array shown in FIG. 1, and FIG. 15 is a circuit diagram illustrating replacing the bit lines of FIG. 14 with resistor columns.

The memory cell array 111 or 211 shown in FIGS. 1 or 2 includes a plurality of blocks. Each block includes a plurality of cell strings as shown in FIG. 14.

The plurality of cell strings of the block are connected to each other in series. Bit lines connected each to the serially connected cell strings are the page buffer 113 or 213. The bit lines are serially connected to all of the blocks BLK1~BLKn. Thus, a bit line of the first block BLK1 is different from that of the n-th block BLKn in resistance. The resistance of the bit line is represented by resistors as shown in FIG. 15.

Figure 16:
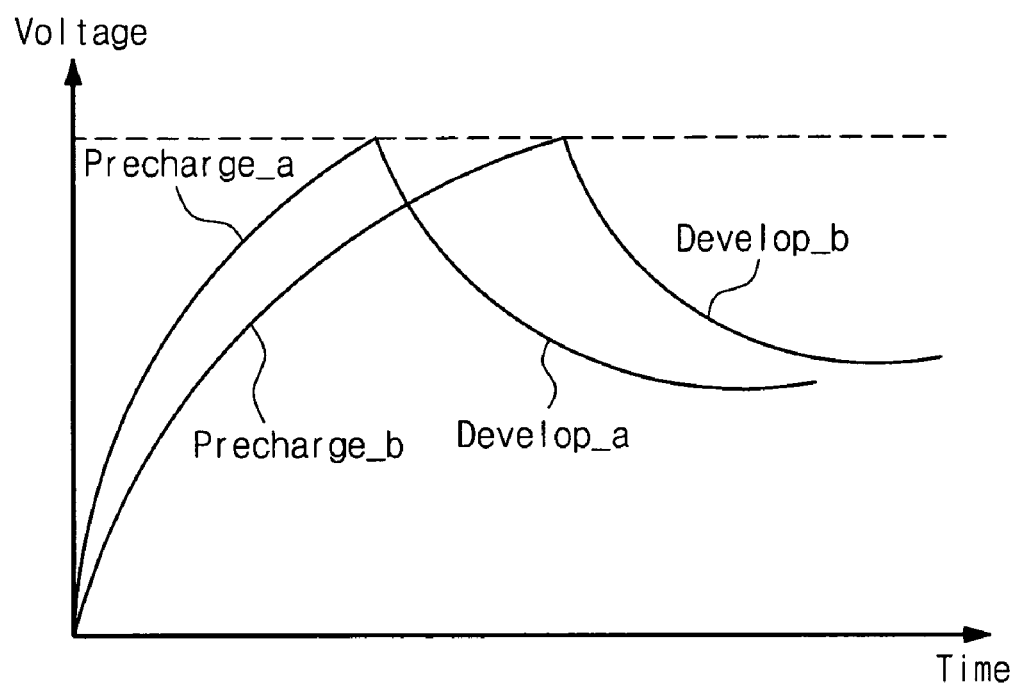
FIG. 16 is a graphic diagram plotting precharging/developing voltages according to example embodiments.

FIG. 16 is a graphic diagram plotting precharging/developing voltages according to example embodiments. The precharging/developing voltages are variable in accordance with physical locations of the blocks.

In FIG. 16 are shown the a-th precharging and developing voltages, precharge_a and develop_a, according to the a-th plane, block, and page, and the b-th precharging and developing voltages, precharge_b and develop_b, according to the b-th plane, block, and page.

Referring to FIGS. 14 through 16, the precharging/developing voltages of the first block BLK1 vary differently from the precharging/developing voltages of the n-th block BLKn with time. For example, as shown in FIG. 15, the bit line of the n-th block BLKn is longer than that of the first block BLK1, so the resistance of BLKn is larger than that of BLK1. Thus, the precharging/developing voltages of the n-th block BLKn is slower in variation relative to that of BLK1.

Therefore, the precharging/developing voltages corresponding to each plane, block, and page are evaluated with time and stored in the parameter map or flag In general, a flash memory device is able to repair an error, which is caused by a tail bit, through an ECC block. However, for situations where a repair to an error is not possible by the ECC block, example embodiments offers ways for overcoming a limitation relevant to the error correction by applying a scheme of ARL (i.e., adapted read-voltage level). A way of finding the maximum value of the threshold voltage distribution will be now discussed in more detail in conjunction with FIGS. 17 through 21.

Figure 17:
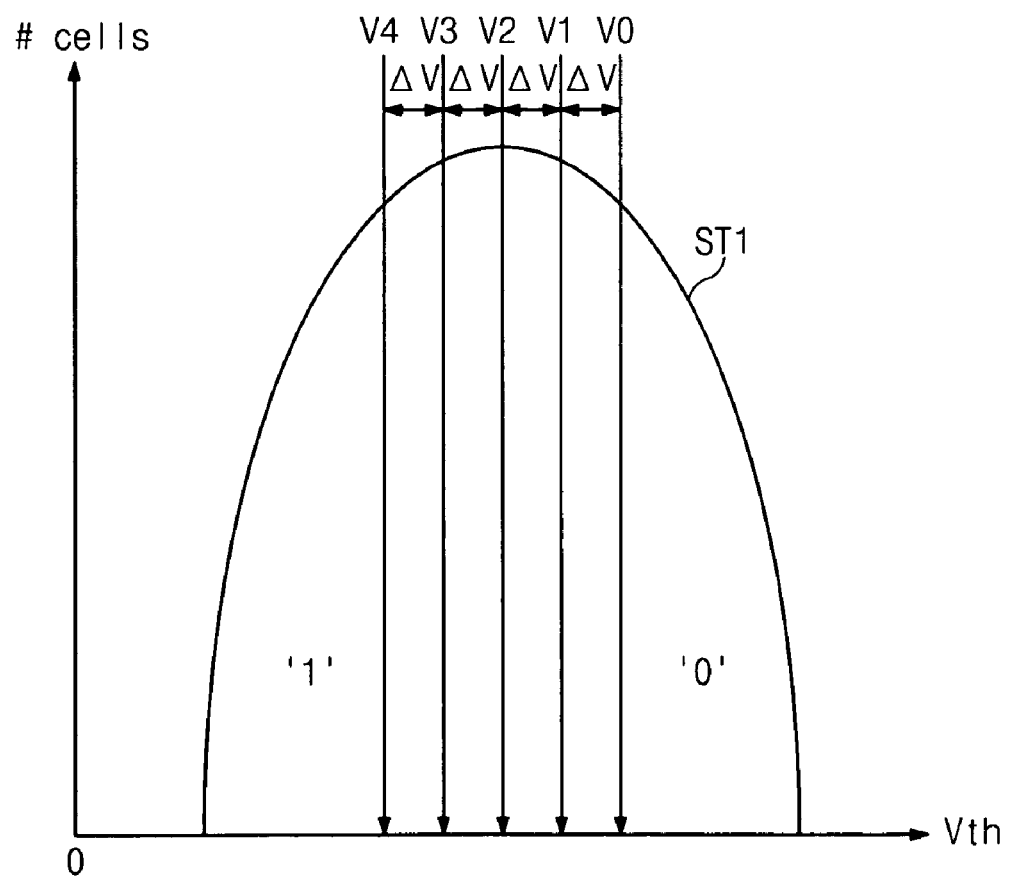
FIGS. 17 and 18 are graphic diagrams showing the maximum values of the threshold voltage distributions according to example embodiments.
Figure 18:
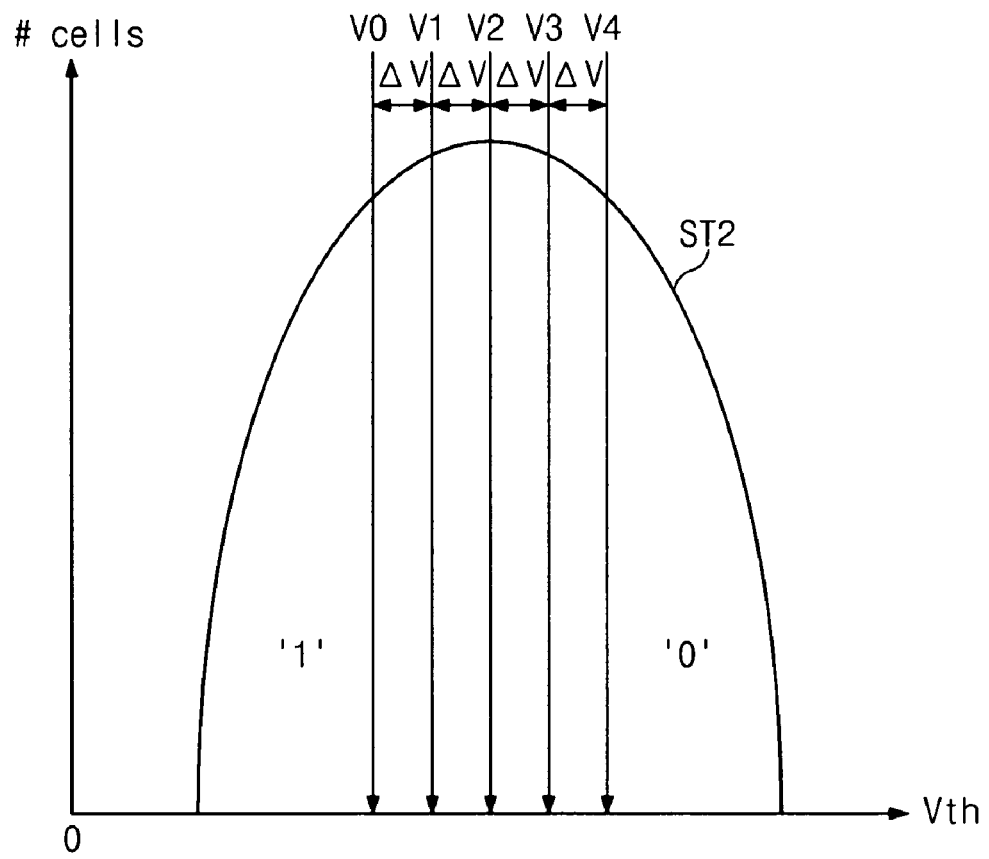

FIGS. 17 and 18 are graphic diagrams showing the maximum values of the threshold voltage distributions according to example embodiments.

Figure 19:
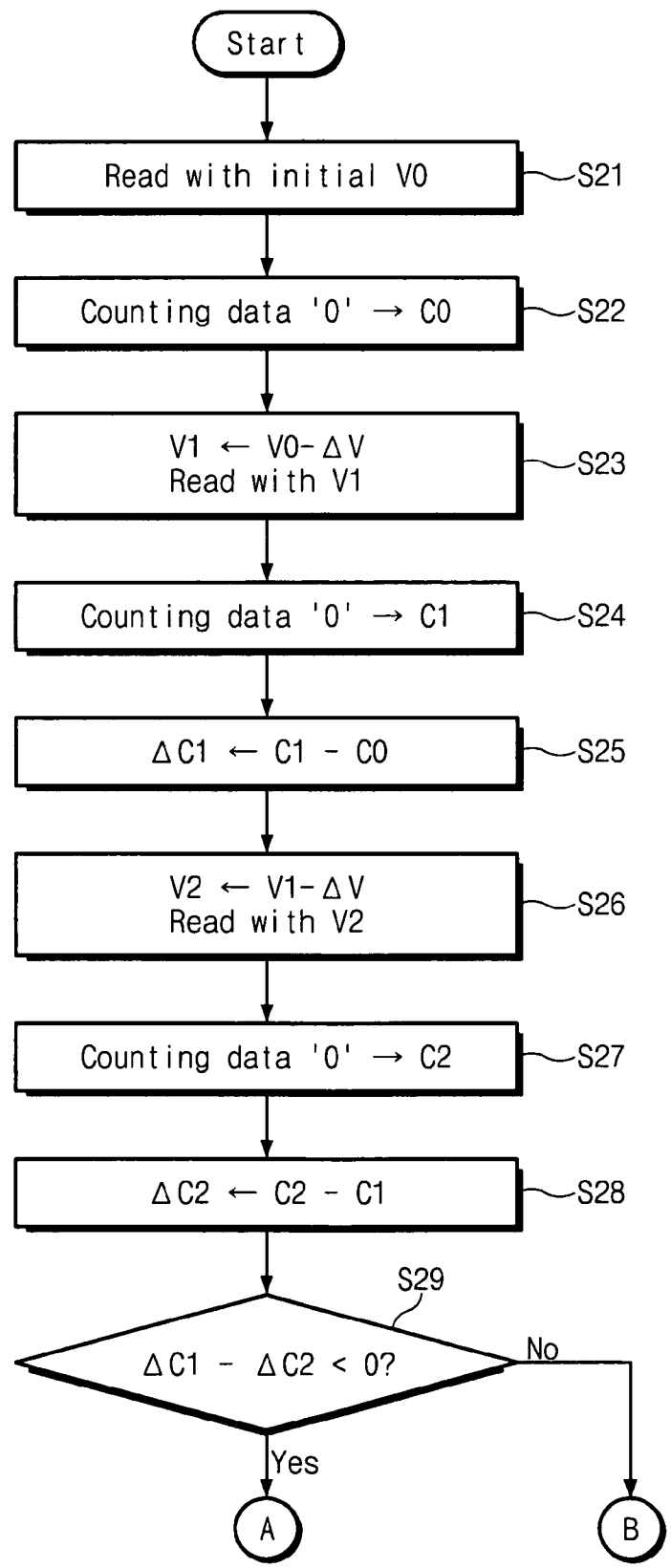
FIGS. 19 through 21 are flow charts showing a way for finding the maximum values of FIGS. 17 and 18.
Figure 20:
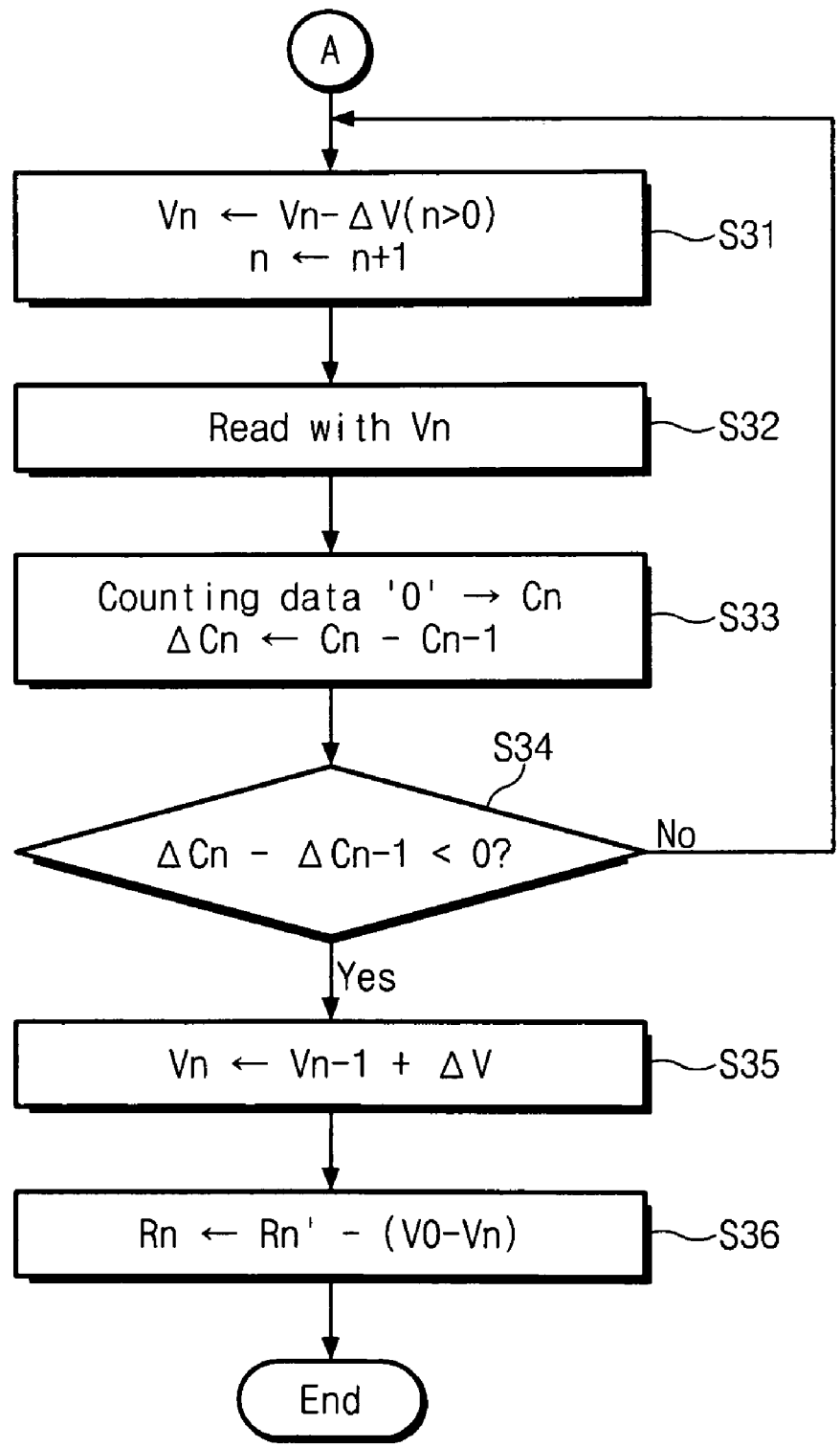
Figure 21:
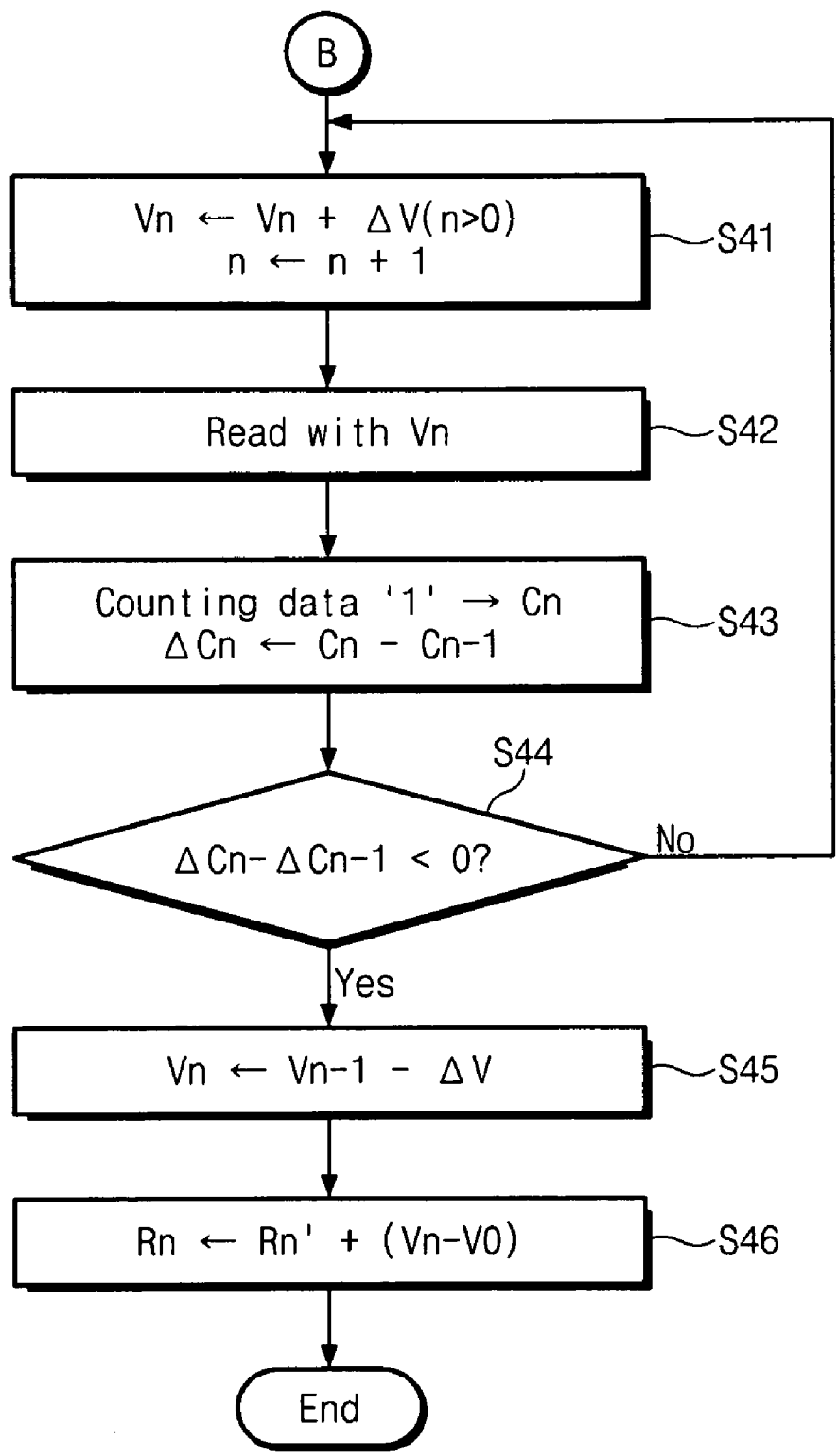

FIGS. 19 through 21 are flow charts showing a way for finding the maximum values of FIGS. 17 and 18.

Referring to FIGS. 17 and 18, due to stress for various reasons, the threshold voltages of memory cells may be partly lower (FIG. 17) or higher (FIG. 18). For example, the graph of FIG. 17, which corresponds to the threshold voltage distribution ST1, shifts leftward from a reference of a voltage V0, while the graph of FIG. 18, which corresponds to the threshold voltage distribution ST2 shifts rightward from the voltage V0.

In the graphs of FIGS. 17 and 18, the X-axes denote threshold voltages or voltages corresponding thereto while the Y-axes denote the numbers of memory cells. On the domain of read voltages V0, V1, V2, V3 and V4, the right side corresponds to data '0' and the left side corresponds to data '0'. The read voltages V0~V4 are arranged with a voltage gap $\Delta V$ from each other.

The flow chart shown in FIG. 19 enables determination of whether the threshold voltage distribution has shifted to the left or right from the reference of the initial read voltage V0. The flow chart of FIG. 20 shows a procedure for finding the maximum value of the threshold voltage distribution ST1 if the threshold voltage distribution has shifted to the left from the initial read voltage V0. The flow chart of FIG. 21 shows a procedure for finding the maximum value of the threshold voltage distribution ST2 if the threshold voltage distribution has shifted to the right from the initial read voltage V0.

Referring to FIGS. 17 through 19, the level of the initial read voltage V0 is equivalent to the maximum value of the prior threshold-voltage distribution. Otherwise, the initial read voltage V0 may be configured to an arbitrary level. In finding (or detecting) the maximum value of the threshold voltage distribution by example embodiments, a reading operation begins (S21) after setting the initial read voltage V0. The number of memory cells verified as passed is counted with reference to the initial read voltage V0. Next, the number of bits with data '0' is counted with reference to the initial read voltage V0 and the counted value is stored into C0 (S22). Next, the reading operation is carried out with the first read voltage V1, after setting a read voltage level on the first read voltage V2 through shifting the read voltage level to left by $\Delta V$ (23). Next, the bit number of data '0' is counted with reference to the first read voltage V1 and stored in C1 (S24). Then, a result of subtracting C0 from C1 is stored in $\Delta C1$ (S25). Thereafter, the reading operation is carried out with the second read voltage V2, after setting a read voltage level on the second read voltage V2 through shifting the read voltage level to left by $\Delta V$ (S26). The number of memory cells is counted with reference to the second read voltage V2. And, the bit number of data '0' is counted with reference to the second read voltage V2 and stored in C2 (S27). A result of subtracting C1 from C2 is stored in $\Delta C2$ (S28).

A resultant value obtained by subtracting $\Delta C2$ from $\Delta C1$ is compared to '0' (S29). If $\Delta C1$ is larger than $\Delta C2$, the threshold voltage distribution shifts to right as shown in FIG. 18. If $\Delta C1$ is smaller than $\Delta C2$, the threshold voltage distribution shifts to left as shown in FIG. 17. If $\Delta C1$ is larger than $\Delta C2$, the procedure goes to the stage A. If $\Delta C1$ is smaller than $\Delta C2$, the procedure goes to the stage B. Thus, if $\Delta C1$ is larger than $\Delta C2$, the maximum value of the threshold voltage distribution is found out by shifting the read voltage to the right by $\Delta V$. If $\Delta C1$ is smaller than $\Delta C2$, the maximum value of the threshold voltage distribution is found out by shifting the read voltage to the left by $\Delta V$.

Referring to FIGS. 17 and 20, assuming that the threshold voltage distribution has moved to the left, the read voltage Vn shifts to left by $\Delta V$ and a value of n increases by 1 (S31). Then, the reading operation is carried out with reference to the read voltage Vn of the current stage (S32). The number of memory cells passed is based with reference to the current read voltage Vn. With reference to the read voltage Vn of the current stage, the bit number of data '0' is counted and stored in Cn. And, a result of subtracting Cn−1 from Cn is stored in ΔCn (S33). A result of subtracting ΔCn−1 from ΔCn is compared to '0'. If ΔCn is larger than ΔCn−1 , then steps S31-S33 are repeated. If ΔCn is smaller than ΔCn−1 , Vn−1 corresponds to the maximum value of the threshold voltage distribution. Thus, ΔV is added to Vn−1 (S35). As a result, the new read voltage level Rn is obtained by subtracting a gap of V0−Vn from the prior read voltage level Rn' (S36).

Now referring to FIGS. 18 and 21, assuming that the threshold voltage distribution has moved to right, the read voltage Vn shifts to right by ΔV and the value of n increases by 1 (S41). Then, the reading operation is carried out with the read voltage Vn of the current stage (S42). The number of memory cells failed is based with the reference to the current read voltage Vn. With reference to the read voltage Vn of the current stage, the bit number of data '1' is counted and stored in Cn. And, a result of subtracting Cn−1 from Cn is stored in ΔCn (S43).

A resultant value of subtracting ΔCn−1 from ΔCn is compared to '0' (S44). If ΔCn is larger than ΔCn−1 , the steps S41-S43 is repeated. If ΔCn is smaller than ΔCn−1 , Vn−1 corresponds to the maximum value of the threshold voltage distribution. Thus, ΔV is subtracted from Vn−1 (S45). Hence, the new read voltage level Rn is obtained by adding a gap of Vn-V0 from the prior read voltage level Rn' (S46).

Example embodiments are able to configure a read voltage level (e.g., adapted read voltage level; ARL) even if there is a tail bit on the threshold voltage distribution. Further, example embodiments are able to use dummy cells for storing reference data or normal memory cells in order to configure the modified read-voltage level. And, example embodiments are able to optimize or determine a proper read voltage level for each block.

Figure 22:
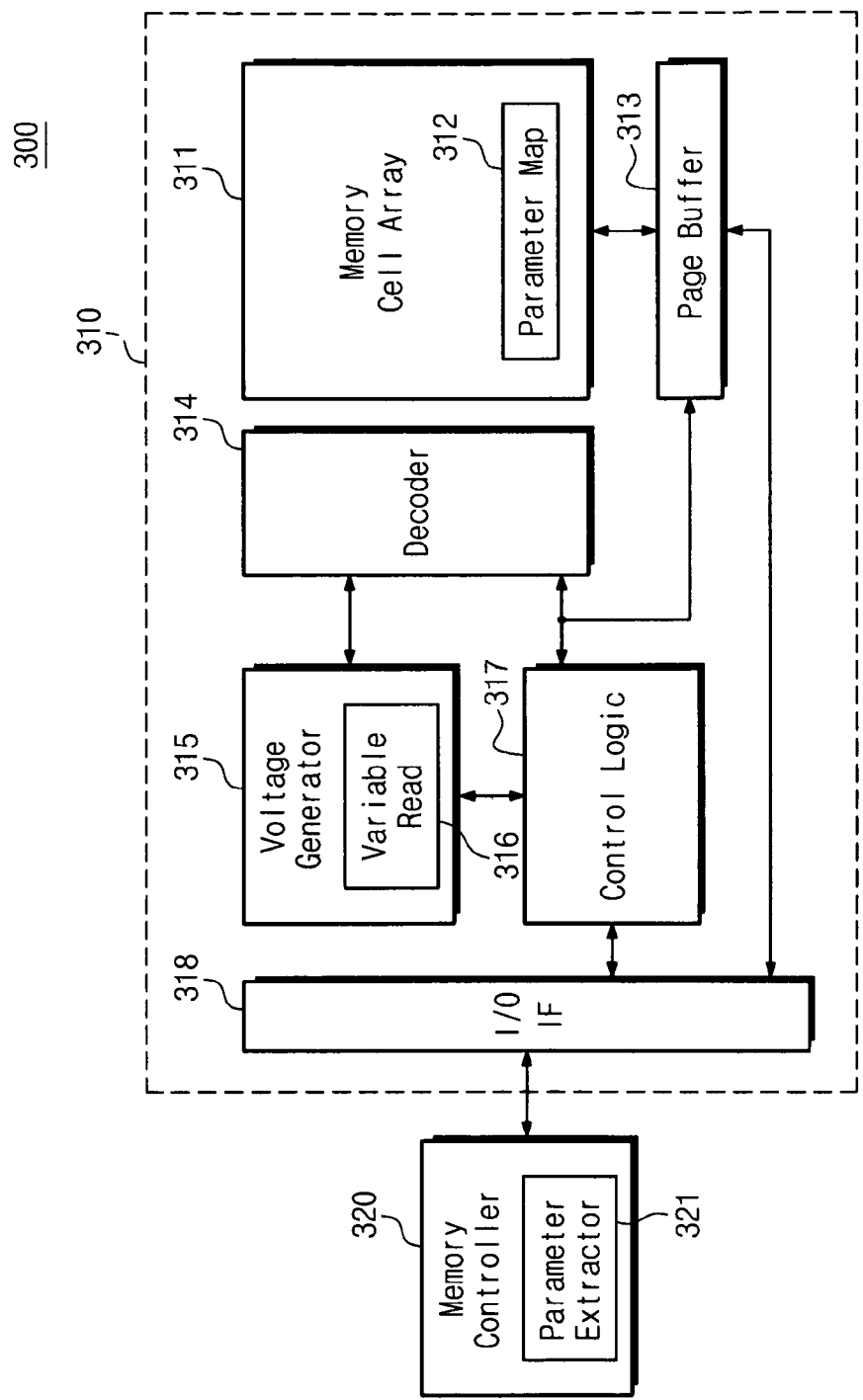
FIG. 22 is another block diagram of a flash memory system according example embodiments.

FIG. 22 is another block diagram of a flash memory system according to example embodiments.

Referring to FIG. 22, the flash memory system according to example embodiments includes a flash memory device 310, and a controller 320 storing parameters to access the memory block, detect variation of the parameters while accessing the memory block, and storing the varied parameters into the flash memory device by a result of the detection. The controller 320 includes a parameter extractor 321. The parameter extractor 321 utilizes the varied parameters stored in the flash memory device while accessing one or more memory blocks among the plural memory blocks.

The flash memory device 310 includes a memory cell array 311 having a plurality of memory blocks, and a control logic circuit 317 controlling the programming, erasing, and reading operations.

The parameter according to example embodiments may include at least one of program-start voltage, erase-start voltage, duration of pulse applied during the programming and erasing operations (i.e., pulse time), ISPP step level, the maximum number of pulse loops, read voltage level, and precharging/developing voltages by time. Those elements in FIG. 22 not described above may be similar to corresponding elements in FIG. 1. Thus, a description of those similar elements is omitted herein.

Flash memory devices are types of nonvolatile memory devices capable of keeping data stored therein even without a power supply. With a rapid increase of mobile apparatuses such as cellular phones, personal digital assistants (PDA), digital cameras, portable gaming consoles, and MP3 players, the flash memory devices are widely employed as code storage, as well as data storage. The flash memory devices may be also utilized in home applications such as high-definition televisions (HDTV), digital versatile disks (DVD), routers, and global positioning systems (GPS).

Figure 23:
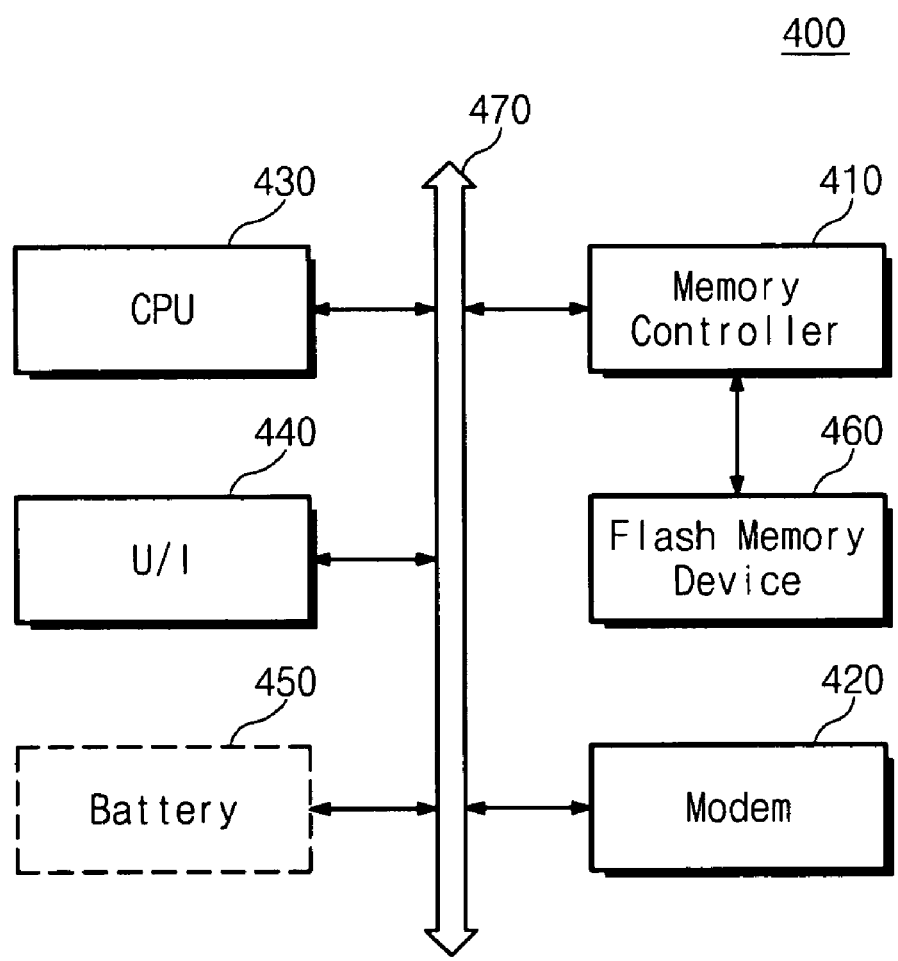
FIG. 23 is a block diagram of a computing system including a memory system according to example embodiments.

FIG. 23 is a block diagram of a computing system 400 including a memory system according to example embodiments. The computing system 400 includes the flash memory system described in example embodiments. The computing system 400 according to example embodiments is organized by including a microprocessor (CPU) 430, a user interface 440, a modem 420 such as a baseband chipset, a memory controller 410, and a flash memory device 460, all of which are connected to each other by way of a bus 470. The memory controller 410 operates to control the flash memory device 460. In the flash memory device 460, N-bit data (N is a positive integer) processed or to be processed by the CPU 430 may be stored through the memory controller 410. If the computing system 400 shown in FIG. 23 is a type of mobile apparatus, it may be further include a battery 450 for supplying power thereto. Although not shown in FIG. 23, the computing system 400 may be further equipped with an application chipset, a camera image processor (e.g., complementary metal-oxide-semiconductor (CMOS) image sensor; i.e., CIS), a mobile DRAM, etc. The memory controller 410 and the flash memory device 460, for example, are able to constitute a solid state drive/disk (SSD) using a nonvolatile memory for storing data. An exemplary SSD is disclosed in U.S. Patent Publication No. 2006-0152981, which is incorporated herein by reference. The memory controller 410 and the flash memory device 460 may also form a memory card using a nonvolatile memory for storing data.

Figure 24:
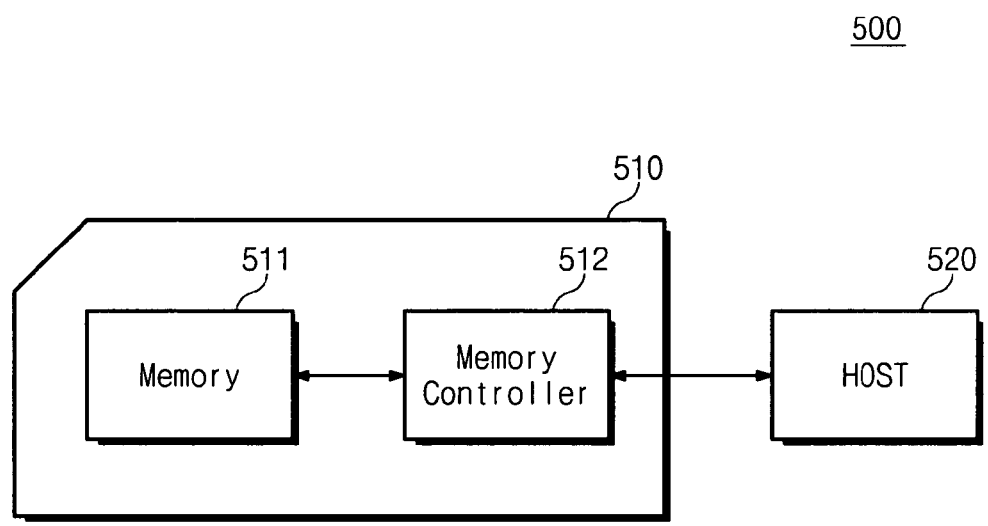
FIG. 24 is another block diagram of a memory-based storage system according to example embodiments.

FIG. 24 is another block diagram of a memory-based storage system according to example embodiments.

The memory-based storage unit 500 shown in FIG. 24 is implemented in a form of card 510 by including a memory 511 and a memory controller 512. For instance, the card 510 may be a kind adaptable to an industrial standard for using electronic apparatuses such as digital cameras, personal computers, and so on. Additionally, it may be seen that the memory controller 512 is able to control the memory 511 in response to control signals received from a host 520 by the card 510.

The above-disclosed subject matter is to be considered illustrative, and not restrictive, and the appended claims are intended to cover all such modifications, enhancements, and other embodiments, which fall within the true spirit and scope of example embodiments. Thus, to the maximum extent allowed by law, the scope of example embodiments is to be determined by the broadest permissible interpretation of the following claims and their equivalents, and shall not be restricted or limited by the foregoing detailed description.

What is claimed is:

1. A nonvolatile memory device comprising:
a memory cell array having a plurality of memory blocks; and
a control logic circuit configured to store a parameter to access at least one of the plurality of memory blocks, configured to detect a variation of the parameter while accessing the at least one the memory block, and configured to store the varied parameter into the memory cell array in accordance with a result of the detection,
wherein the control logic circuit is configured to utilize the varied parameter, which is stored in the memory cell array, while accessing the at least one memory block.

wherein the control logic circuit is configured to detect a maximum value of a threshold voltage distribution of memory cells of the memory cell array, and configured to set a read voltage with reference to a result of the maximum value detected, and wherein the maximum value of the threshold voltage distribution corresponds to a same number of passed and failed memory cells of the memory cell array.

2. The device of claim 1, wherein the parameter includes at least one of program-start voltage, erase-start voltage, duration of pulse applied during program and erasing operations, ISPP step level, the maximum number of pulse loops, pass voltage applied to unselected cells, read voltage level, precharging and developing voltages by time, and read voltage level applied to unselected regions.

3. The device of claim 2, wherein the control logic circuit is configured to program the memory cell array to a target-voltage level according to a program voltage and configured to set the program voltage as the program-start voltage if at least one memory cell of the memory cell array corresponding to at least one bit is programmed.

4. The device of claim 2, wherein the control logic circuit is configured to erase the memory cell array to a target voltage level according to an erase voltage and configured to set the erase voltage as the erase-start voltage if at least one memory cell of the memory cell array corresponding to at least one bit is erased.

5. The device of claim 1, wherein the parameter is stored in at least one of the plurality of memory blocks.

6. The device of claim 1, wherein the at least one memory block includes data and spare fields, where the spare field stores the parameter.

7. The device of claim 1, wherein the memory cell array includes at least one of a phase-change random access memory, magneto-resistance random access memory, and resistive random access memory.

8. A nonvolatile memory system comprising:
a nonvolatile memory device having a plurality of memory blocks; and
a controller configured to store a parameter to access at least one of the memory blocks, configured to detect variation of the parameter while accessing the at least one memory block, and configured to store the varied parameter into the nonvolatile memory device in accordance with a result of the detection, wherein the controller is configured to utilize the varied parameter, which is stored in the nonvolatile memory device, while accessing the at least one memory block, wherein the controller is configured to detect a maximum value of a threshold voltage distribution of memory cells of the memory cell array, and configured to set a read voltage with reference to a result of the maximum value detected, and wherein the maximum value of the threshold voltage distribution corresponds to a same number of passed and failed memory cells of the memory cell array.

9. The system of claim 8, wherein the parameter includes at least one of program-start voltage, erase-start voltage, duration of pulse applied during program and erasing operations, ISPP step level, the maximum number of pulse loops, read voltage level, and precharging and developing voltages by time.

10. The system of claim 9, wherein the nonvolatile memory device comprises:
a memory cell array having the plurality of memory blocks; and
a control logic circuit configured to control programming, erasing, and reading operations of the memory cell array.

11. The system of claim 10, wherein the controller is configured to program the memory cell array to a target voltage level according to a program voltage and configured to set the program voltage as the program-start voltage if at least one memory cell of the memory cell array corresponding to at least bit is programmed.

12. The system of claim 10, wherein the controller is configured to erase the memory cell array to a target voltage level according to an erase voltage and configured to set the erase voltage as the erase-start voltage if at least one memory cell of the memory cell array corresponding to at least one bit is erased.

13. The system of claim 8, wherein the parameter is stored in at least one of the plurality of memory blocks.

14. The system of claim 10, wherein the at least one memory block includes data and spare fields, where the spare field stores the parameter.

15. The system of claim 8, wherein the nonvolatile memory device includes at least one of a phase-change random access memory, magneto-resistance random access memory, and resistive random access memory.

* * * * *